United States Patent
Ieong et al.

(10) Patent No.: US 6,466,489 B1
(45) Date of Patent: Oct. 15, 2002

(54) USE OF SOURCE/DRAIN ASYMMETRY MOSFET DEVICES IN DYNAMIC AND ANALOG CIRCUITS

(75) Inventors: Mei Kei Ieong, Wappingers Falls, NY (US); Edwin Chih-chuan Kan, Ithaca, NY (US); Hon-Sum Philip Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/861,295

(22) Filed: May 18, 2001

(51) Int. Cl.[7] ................................................. G11C 7/00
(52) U.S. Cl. ............................. 365/189.09; 257/404
(58) Field of Search ................................. 257/393, 404; 438/266, 286, 305; 327/157; 365/154, 189.09

(56) References Cited

U.S. PATENT DOCUMENTS

| | | | | |
|---|---|---|---|---|
| 4,439,692 A | | 3/1984 | Beekmans et al. | 307/297 |
| 5,081,371 A | | 1/1992 | Wong | 307/296.2 |
| 5,386,151 A | | 1/1995 | Folmsbee | 327/536 |
| 5,524,266 A | | 6/1996 | Tedrow et al. | 395/800 |
| 5,557,569 A | * | 9/1996 | Smayling et al. | 365/185.28 |
| 5,589,697 A | | 12/1996 | Smayling et al. | 257/204 |
| 5,650,340 A | * | 7/1997 | Burr et al. | 437/30 |
| 5,774,411 A | | 6/1998 | Hsieh et al. | 365/230.06 |
| 5,790,452 A | | 8/1998 | Lien | 365/154 |
| 5,943,271 A | | 8/1999 | Fujita | 365/189.09 |
| 6,064,251 A | * | 5/2000 | Park | 327/536 |
| 6,191,963 B1 | | 2/2001 | McPartland et al. | 363/60 |
| 6,255,174 B1 | * | 7/2001 | Yu | 438/286 |
| 6,274,450 B1 | * | 8/2001 | Lin et al. | 438/305 |
| 6,287,917 B1 | * | 9/2001 | Park et al. | 438/262 |
| 6,297,104 B1 | * | 10/2001 | Tyagi et al. | 438/286 |
| 6,303,479 B1 | * | 10/2001 | Snyder | 438/581 |
| 6,180,461 B1 | * | 1/2002 | Ogura | 438/266 |
| 6,344,405 B1 | * | 2/2002 | Saha | 438/514 |

OTHER PUBLICATIONS

Wu et al., "MOS Charge Pumps for Low Voltage Operation" IEEE J. of Solid State Ckts., vol. 33, NO. 4, pp. 592–597, (Apr. 1998).

* cited by examiner

Primary Examiner—David Nelms
Assistant Examiner—Tu-Tu Ho
(74) Attorney, Agent, or Firm—Graham S. Jones, II; H. Daniel Schnurmann (57) ABSTRACT

A CMOS charge pump circuit with diode connected MOSFET transistors is formed with asymmetric transistors which preferably have halo source region implants with a forward threshold voltage ($V_{thF}$) and with a reverse threshold voltage ($V_{thR}$), with the forward threshold voltage $V_{thF}$ being substantially larger than the reverse threshold voltage $V_{thR}$. Preferably, the halo source regions are super halos. An SRAM circuit with pass transistors and pull down transistors includes pass transistors which comprise super halo asymmetric devices.

24 Claims, 10 Drawing Sheets

USE OF SOURCE/DRAIN ASYMMETRY MOSFET DEVICES IN DYNAMIC AND ANALOG CIRCUITS

BACKGROUND OF THE INVENTION

1. Field of the Invention

This invention relates to semiconductor devices and more particularly to CMOS circuits.

2. Description of Related Art

The design trade-off between low-power and signal strength in dynamic and analog circuits usually determines the selection of threshold voltage $V_{th}$ in the CMOS technology. However, the threshold voltage $V_{th}$ is not easily scalable with the continuous voltage and geometrical scaling in CMOS transistor technology.

Source/drain asymmetry effects in charge pumps embodied with CMOS transistors have been discussed in the literature, but all previous work has focused on the comparison with the symmetrical devices in the forward biasing directions. Parasitic RC elements and carrier transport in tailored channel electric fields have been studied. None of the previous work has proposed to use both biasing directions to achieve better dynamic and analog circuit design.

U.S. Pat. No. 4,439,692 of Beekmans et al. for "Feedback-Controlled Substrate Bias Generator" describes a charge pump with three diodes connected in series and a pair of capacitors which have one plate connected to the junctions between the diodes. The other plate of each capacitor is connected to voltage sources which alternate between high and low values with one voltage always being high when other voltage is low.

U.S. Pat. No. 5,081,371 of Wong for "Integrated Charge Pump Circuit with Back Bias Voltage Reduction" shows a charge pump with three NMOS transistors connected in a series by source to diode connections. The NMOS transistors which are connected as diodes with the gate shorted to the drain. There are three capacitors connected to the sources of the transistor with the two intermediate capacitors connected to clock signals which are 180° out of phase with each other as provided by inverter circuits driven by a common clock.

U.S. Pat. No. 5,386,151 of Folmsbee for "Low Voltage Charge Pumps Using P-Well Driven MOS Capacitors" describes the operation of a charge pump formed by diode connected nMOS FET devices with the gate shorted to the drain and MOS capacitors formed with a p-well acting as one plate thereof.

U.S. Pat. No. 5,589,697 of Smayling et al. for "Charge Pump Circuit with Capacitors" shows a series of Schottky diodes with one plate of a separate capacitor connected to the cathode of each of the diodes. The other plates of the capacitors are connected to alternate phase clock pulses generated by clock circuitry.

U.S. Pat. No. 5,524,266 of Tedrow et al. for "System Having Multiple Phase Boosted Charge Pumps with a Plurality of Stages" shows a charge pump circuit in which each stage includes a storage capacitor plus two FET devices which include a switching transistor and a control transistor. Either four or two different clock signals are employed in the embodiments shown.

U.S. Pat. No. 5,943,271 of Fujita for "Semiconductor Integrated Circuit Device" shows a modified Dickson type pMOS FET charge pump circuit with two clocks with different phases devices to bias a semiconductor substrate or a well.

Wu et al. "MOS Charge Pumps for Low-Voltage Operation" describes a traditional Dickson four stage charge pump in which MOSFET devices are connected as diodes, so that the charge thereon can be pumped. The paper describes other charge pumps for low-voltage operation, greater pumping gains, and higher output voltages that a Dickson charge pump. A first embodiment comprises a four-stage charge pump with static charge transfer switch (CTS) stages. Each stage includes at least two MOS devices connected in parallel. For each stage, in addition to the usual diode connected MOSFET transistor, there is a charge transfer switch (CTS) transistor connected in parallel with the diode connected transistor. The CTS transistors have their gate electrodes connected to the output of the next stage of the four-stage device. There is also a dynamic CTS transistor embodiment in which each CTS is controlled by a pair of pass transistors.

U.S. Pat. No. 6,191,963 of McPartland et al. for "Charge Pump with No Diode Drop at Output Stage" describes a charge pump with a series of stages with each stage including a transistor, a diode connected transistor, and a capacitor with the transistor and the diode connected transistor forming a charge transfer switch. The switches are controlled by alternately by inverted clock signals.

Charge pump circuits can boost the voltage on the wordlines (WL) of SRAM/DRAM devices, and provide large write/erase voltages for EEPROM and/or FLASH devices. For System-on-Chip (SoC) applications integrating various functional components with different voltage scaling, voltage multiplication is essential. Due to requirements for low-power, charge pumps need to be efficient in terms of power conversion and voltage multiplication. Conventional charge pumps and voltage multipliers are implemented by one-direction switches to push charges to a storage capacitor in a Dickson type charge pump circuit which is described in Wu et al. above.

Figure 3:
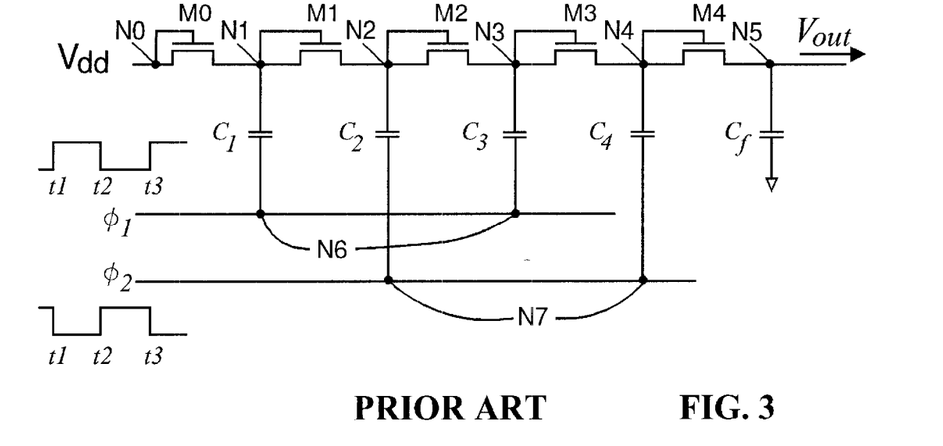
FIG. 3 shows a prior art type of MOSFET charge pump circuit which can generate a voltage higher than a source voltage Vdd.

FIG. 3 shows a prior art Dickson type of MOSFET charge pump circuit which can generate a voltage higher than a source voltage Vdd. The charge pump circuit of FIG. 3 consists of N-MOSFETs (Metal Oxide Semiconductor Field Effect Transistors) M0 to M4 connected in series with each MOSFET transistor connected as a diode by having its gate and drain connected/short circuited together at nodes N0–N4. Each of a set of charge pump capacitors $C_1$–$C_4$ has one of its two terminals connected to the respective junction N1–N4 of the gates and drains of the MOSFETs M1–M4, as well as, being connected to the sources of MOSFETs M0–M3. A fifth capacitor $C_f$ is connected to the source electrode of the FET M4.

FIG. 3 also shows the input waveforms of clocks $\phi_1$ and $\phi_2$. The two clock inputs are operated 180° out of phase with respect to each other and are alternately applied to the other ends of the capacitors $C_{1-4}$ with the capacitors $C_1$ and $C_3$ connected through node N6 to clock line $\phi_1$ and the capacitors $C_2$ and $C_4$ connected through node N7 to clock line $\phi_2$.

The drain and gate of the MOSFET M1 are connected to the source voltage Vdd via an N-MOS FET M0. The source of the FET M4 serves to provide the output voltage of the circuit. When the voltage on the node N1 increases, the first FET M0 can prevent a charge from migrating from the junction N1 to the source voltage Vdd.

Principle of Operation of a Dickson Charge Pump Circuit

Referring to FIG. 3, assume that the threshold voltage of the n-MOSFET M0 is Vt0, and that initially the clock $\phi_1$ is at a low level 0V). Then, the potential of the junction (or terminal) N1 is (Vdd−Vt0). When the clock $\phi_1$ is switched to a high level at time t1, a potential at the junction N1 can be expressed by the following equation:

$$(Vdd-Vt0)+V\phi_1(C_1/(C_1+C_{1S})) \qquad \text{Eq.(1)}$$

where $V\phi_1$ is the voltage amplitude of the clock $\phi_1$, and $C_{1S}$ is the parasitic capacitance (not shown in the figure).

At this point, the clock $\phi_2$ is at a low level (0V), but the potential on the junction N2 is raised by the flow of charge (filling) the capacitor $C_2$ by discharging (emptying) charge Q1 from the capacitor $C_1$. The charge Q1 migrates (is pumped) from the junction N1 through to the junction N2 into capacitor $C_2$ and increases the potential of the junction N2. The maximum potential of junction N2 can be expressed as:

$$(Vdd-Vt0)+V\phi_1(C_1/(C_1+C_{1S}))-Vt1 \qquad \text{Eq.(2)}$$

where Vt1 is the threshold voltage of the MOSFET M1.

Thus, it can be shown that the circuit can boost the voltage by the increment $V\phi(C/(C+C_S))-Vt$ at each pumping stage.

The potential of the junction N1 is lowered when the clock $\phi_1$ is switched to a low level (0V). At the same time, a charge corresponding to the charge Q1 is fed from the power source Vdd to the junction N1 via the MOSFET M0, thereby setting up a potential of (Vdd-Vt0). Similarly, the potential of the junction N2 is raised when the clock $\phi_2$ is switched to a high level. Thus, a charge of Q2 migrates (is pumped) from the junction N2 to a junction N3 and boosts the potential of the junction N3 by charging (filling) the capacitor $C_3$.

In this manner, charge is pumped sequentially (analogously to a bucket brigade) from the MOSFET M1 to the MOSFET M2, then to the MOSFET M3, and then to the MOSFET M4. Finally, a high voltage appears on the output node, Vout. The maximum output voltage, V max, available with this circuit can be expressed as:

$$V\max=(Vdd-Vt0)+N[V\phi_1C/(C+C_S)-Vt] \qquad \text{Eq.(3)}$$

where

N=number of stages of the circuit.

$V_{100}$=amplitude of the clocks $\phi_1$ and $\phi_2$

C=capacitance of the capacitors $C_1$–$C_4$ $C_S$=stray (parasitic) capacitance of MOSFETs M1–M4

Vt=threshold voltage of the MOSFETs M1–M4

Note that in the case of FIG. 3, since there are four stages N=4.

The efficiency of a charge pump circuit is limited by the ratio between the storage capacitance C and the stray capacitance $C_S$ on the switching node (charge sharing) and by the energy loss on generation of control clock signals. Since the clock frequency will in general increase the pumping efficiency, but simultaneously increase energy used in clock generation, an optimal design may be determined from careful analysis. The voltage gain at each stage in the conventional design is as follows:

$$DV = V_f \frac{C}{C+C_s} - \frac{I_0}{f \cdot (C+C_s)} \qquad \text{(Eq. 4)}$$

where f=clock frequency and $I_0$=the output current loading.

For multi-stage charge pumps to be functional, $\Delta V$ needs to be larger than $V_{th}$ of the switch for Dickson's pass-transistor design, and larger than $V_{th}/2$ for full transmission-gate design. This poses a device design challenge on the choice of $V_{th}$ of the switching transistor. There is a problem with the above design which comprises the dilemma that a lower $V_{th}$ will cause more leakage currents, but that a higher $V_{th}$ will pose a lower bound for the values of storage capacitance (C) and clock frequency (f).

U.S. Pat. No. 5,790,452 of Lien for "Memory Cell Having Asymmetrical Source/Drain Pass Transistors and Method for Operating the Same" shows a 4T (Four Transistor) SRAM (Static Random Access Memory) device with asymmetrical pass transistors and symmetrical pull down transistors.

In the Halo embodiments of the Lien patent, the asymmetric pass transistors include a P-type Halo Source (HS) region between the channel and the source region. In the Halo/GOLD (Gate Overlapped Lightly Doped drain) embodiment, between the drain region and the channel, an N type (GOLD) region was formed by a Large Angle of Tilt (LAT) ion implantation. The HS region was also formed by a LAT ion implantation process. In a variation of the Halo embodiments, the Halo region remains and if it provides the required asymmetric threshold voltage characteristics, then the GOLD region can be eliminated which provides a source region, a drain region, and a halo region adjacent to the source region without any lightly doped regions at all.

In still another case described in Lien, the asymmetrical pass transistors included a P-type interstitial gradient region is formed between the source and the channel region of an NFET device. An interstitial region, near the oxide-silicon interface at the source side of a MOSFET device can be created by damage induced by high energy, high dose N+ ion implantation. The interstitial region can attract boron to pile up at the interface. This boron pile up results in higher threshold voltages at the source side as compared to the local threshold voltage at the drain. This is by definition an asymmetric MOS FET device, but this type of device does not include any halo implant which is critical for contemporary and future CMOS technology to reduce the short channel effect.

In either case, the channel region of the NMOS devices are not indicated to have any difference in doping from the bulk of the P– monocrystalline semiconductor substrate.

SUMMARY OF THE INVENTION

In accordance with this invention, a charge pump comprises first and second clocks having a phase differential; a plurality of stages of each comprising an asymmetric FET transistor with substantially different forward and reverse threshold voltages and a capacitor. Each stage includes an asymmetric FET transistor which includes a semiconductor substrate with a channel, a drain region and a source region. The drain region is connected to a drain electrode, the source region is connected to a source electrode, and a gate electrode stack comprises a silicon oxide layer and a gate electrode formed above the channel. The drain electrode is electrically connected through an input node to the gate electrode of the FET transistor and the source electrode of each stage is connected to an output node. The capacitor of each stage has a first capacitor plate and a second capacitor plate. The first capacitor plate is connected to the source electrode of that stage. The stages are connected in series with the source electrode and the first capacitor plate of a preceding stage is connected to the input node of a succeeding stage, and the second plates of the capacitors are coupled alternately along the sequence of stages to the first clock and the second clock.

Preferably the asymmetric FET transistor has a source region halo implant; which is preferably a source region super halo implant.

Preferably, the source region super halo implant has a shallow counterdoped portion of the channel.

Preferably, the asymmetric FET transistor has a source region super halo implant with a shallow counterdoped portion of the channel and source and drain extensions adjacent to the channel between the source region and the drain region.

Preferably there is an abrupt halo contour resulting from a single RTA cycle.

Further in accordance with this invention, a semiconductor integrated charge pump circuit is driven on the basis at least two clocks in which for each positive integer "i" from 1 to n-1, the ith stage of the charge pump circuit is caused to have a structure in which it has large current drivability, but lower maximum arrival voltage as compared to the (i+1)-th stage of the charge pump circuit, and each stage includes an asymmetric MOSFET device connected to an alternate one of the clocks through the capacitor associated therewith.

Preferably, the asymmetric FET transistor has a source region halo implant which is preferably a super halo implant. Preferably, the asymmetric FET transistor has a source region super halo implant with a shallow counterdoped portion of the channel and source and drain extensions adjacent to the channel between the source region and the drain region with an abrupt halo contour resulting from a single RTA cycle.

Still further in accordance with this invention a semiconductor integrated charge pump circuit comprises a plurality (n) of charge pump stages (1,2,3,4 ... n) from a first (1th) to a last (nth) stage connected in series comprising odd numbered stages (1, 3, ... ) and even numbered stages (2, 4, ... ); a pair of clock pulse lines, including a first clock pulse line and a second clock pulse line; the first clock pulse line connected to the odd numbered stages (1, 3, ... ) of the charge pump stages; the second clock pulse line connected to the even numbered stages (2, 4, ... ) of the charge pump stages; each stage including an MOSFET transistor including a source, a drain and a gate electrode with the source connected to the drain and a capacitor connected to the source, and each of the MOSFET transistors comprising an asymmetric transistor with a forward threshold voltage ($V_{thF}$) and with a reverse threshold voltage ($V_{thR}$), with the forward threshold voltage $V_{thF}$ is substantially larger than the reverse threshold voltage $V_{thR}$.

Preferably, the asymmetric FET transistor has a source region halo implant which is preferably, a super halo implant preferably with a shallow counterdoped portion of the channel.

Preferably, there are shallow counterdoped portion of the channel and source and drain extensions adjacent to the channel between the source region and the drain region.

In accordance with another aspect of this invention, there is provided a charge pump with pass transistors consisting of super Halo asymmetric devices.

Preferably, the asymmetric FET transistor has a source region super halo implant with a shallow counterdoped portion of the channel and source and drain extensions adjacent to the channel between the source region and the drain region; preferably with an abrupt halo contour resulting from a single RTA cycle.

A method of forming an asymmetric MOSFET in a charge pump circuit comprises forming an asymmetric FET transistor of each stage including a semiconductor substrate with a channel, forming a gate electrode stack comprising a silicon oxide layer and a gate electrode formed above the channel, forming a drain region and a source region, the drain region is connected to a drain electrode, the source region is connected to a source electrode, connecting the drain electrode electrically connected through an input node to the gate electrode of the FET transistor and connecting the source electrode of each stage is connected to an output node.

Preferably the method includes forming the asymmetric FET transistor with substantially different forward and reverse threshold voltages, forming a capacitor, with the capacitor of each stage having a first capacitor plate and a second capacitor plate with the first capacitor plate is connected to the source electrode of that stage, and the first and second clocks have a phase differential.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figures 1, 2A, 2B:
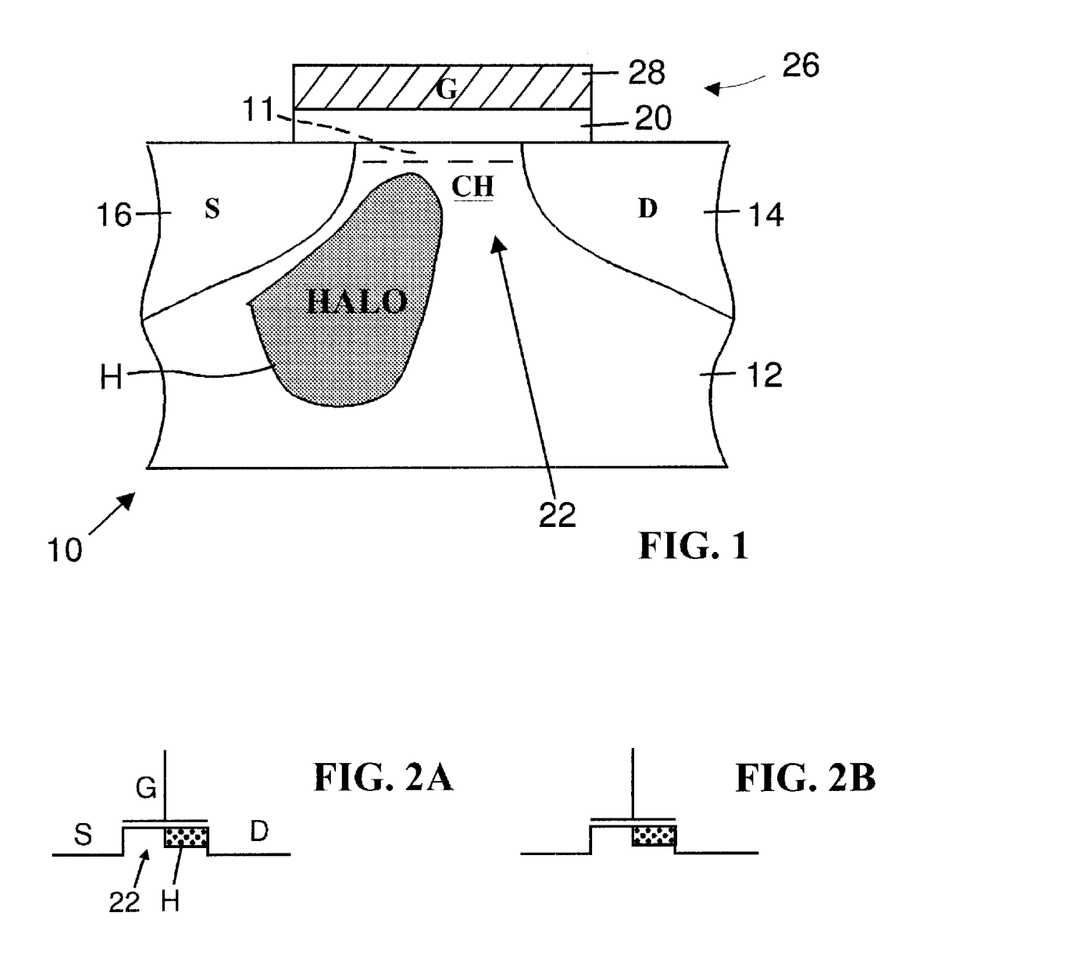
FIG. 1 shows various features of a MOSFET device formed in a doped monocrystalline semiconductor substrate in accordance with this invention.
FIGS. 2A–2D show circuit symbols used herein to illustrate MOSFET S/D asymmetry by various device constructs.

FIG. 1 shows various features of a MOS (Metal Oxide Semiconductor) FET (Field Effect Transistor) device 10 formed in a doped monocrystalline semiconductor substrate 12 in accordance with this invention. The FET device 10 includes a source region 16 and a drain region 14 which are aligned on either side of a gate electrode stack 28 formed by a silicon oxide layer 20 and gate electrode 26 which can be composed of doped polysilicon. Between the source region 16 and the drain region and below the silicon oxide layer 20 is the channel region CH of the FET device 10 which can be a portion of a CMOS (Complementary MOS) structure. A Halo region H 10 is located in the substrate 12 adjacent to the source region 16 and below the channel region CH of the device 10. Preferably, there is a shallow region 11 at the top of the channel region which has been counterdoped with respect to the substrate 12.

NMOS Example

In an NMOS embodiment of the device 10, the substrate 12 is doped with P− dopant, comprising boron (B). The source region 16 and the drain region 14 are doped N+ with at least one type of N type dopant, preferably comprising arsenic (As), but possibly comprising phosphorus (P). If there is a counterdoped region 11, then it is doped with at least one of the N type dopants.

PMOS Example

In a PMOS embodiment of the device 10, the substrate 12 is doped with at least one type of N− type dopant preferably comprising arsenic (As), but possibly comprising phosphorus (P). The source region 16 and the drain region 14 are doped P+ with boron (B) dopant. If there is a counterdoped region 11, then it is doped with boron as a P type dopant.

Super Halo Device

The device 10 of FIG. 1 may comprise a Super Halo device. A Super Halo FET device is distinguished from ordinary Halo FET device by having at least one of the features as follows:

1. The halo H has an abrupt doping profile contour because minimal annealing has been employed and after the halo ion implant only a final source/drain RTA (Rapid Thermal Anneal) has been employed. This contrasts with conventional product which has a dispersion of halo dopant because of several annealing cycles which drive the dopant farther into the device blurring the profile of the halo instead of the single RTA following the halo and source/drain ion implantation cycles.

2. There is counter doped ion implantation in the channel region as shown by region 11 in FIG. 1 which increases the abruptness of the halo H doping profile contour in the vertical dimension. A more abrupt halo profile is desirable for control of the short-channel-effect. The result is that the super halo devices with this feature are more scalable to smaller dimensions than prior art halo implant devices. Any annealing of the counter-doped region 11 is performed prior to formation of the halo region/regions.

3. If there are source/drain extensions 43/44 or 43'/44', as shown and described in connection with FIG. 6C or FIG. 8C below, they are highly or fully doped, i.e. the drain extensions 43/44 or 43'/44' are doped to substantially the same level as the source and drain regions 51/52 or 51'/52' and the LDD/LDS (Lightly Doped Drain/Lightly Doped Source) type of doping is not employed.

4. Preferably, the source/drain extensions 43/44 or 43'/44' are shallow to achieve high current drive while at the same time achieving good control of the short-channel-effect.

5. In a preferred embodiment show in FIGS. 6D, 6E and FIGS. 8D, 8E the doping of the halo is performed from several angles as indicated in FIGS. 7 and 9 (as described below) so that there is a minor halo region 46 adjacent to the drain extensions 44/44' in FIGS. 6E/8E. The resulting halo profiles from several directions excluding the drain side direction can produce an asymmetric halo profile while at the same time enhancing control of the short-channel-effect.

FIGS. 2A–2D show circuit symbols used herein to illustrate MOSFET S/D asymmetry by various device constructs. The rectangle with the dots denotes the better current blocking direction.

Figure 2C:
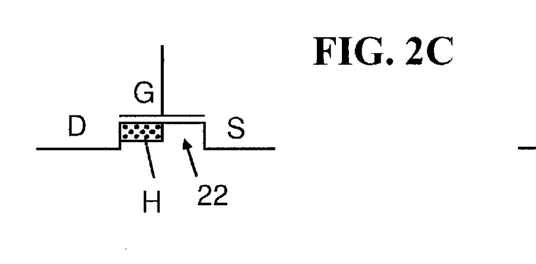
Figure 2D:
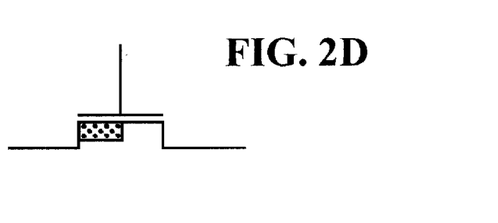

FIG. 2A shows a symbol for an asymmetric MOSFET device including a source S, a drain D, and a gate G. There is an asymmetric halo H on the source side indicated by the rectangle with dots therein adjacent to the source region S and with a clear region 22 between the halo H and the drain D. The schematic symbol of FIG. 2A is further simplified in FIG. 2B showing the usual FET symbol with the halo H on one side. FIGS. 2C and 2D show the devices of FIGS. 2A and 2B modified by moving the halo H to the right side and right/left reversal of the source S, drain D and clear region 22.

Threshold Voltage ($V_{th}$)

Forward Threshold Voltage ($V_{thF}$) comprises current flow from the Drain to the Source $V_D > V_S$ (conventional nMOS) larger $|V_{th}|$.

Reverse Threshold Voltage ($V_{thR}$) comprises current flow from the Source to the Drain $V_D < V_S$ (conventional nMOS) smaller $|V_{th}|$.

This invention provides methods and applications of MOSFET structures with various geometrical source/drain asymmetry features to improve the design trade-off between low-power consumption and signal strength in dynamic RAM and charge-pump circuits to improve the cell design.

Referring again to FIG. 1 various features of a MOS FET device 10 in accordance with this invention with a Halo adjacent to the source region and below the channel region of the device are shown.

In the case of an SRAM device, asymmetrical CMOS pass transistors can pass signals reliably with a lower threshold voltage $V_{th}$, while retaining the signal on load capacitance with a higher threshold voltage $V_{th}$ and hence lower leakage.

Considering a 1.2V CMOS DRAM technology with 0.5 Volt nominal threshold voltage $V_{th}$, the word line (WL) voltage needs to be boosted with charge pumping circuitry to a voltage above 2Volts for storing a strong binary 1. In addition to the fact that the boosting of the voltage consumes more power in larger voltage swing of the WL capacitance and charge-pump circuitry, the boosted voltages also create dielectric reliability problems.

In the case of an DRAM (Dynamic Random Access Memory) device, this invention allows more efficient writing in each DRAM capacitor with or without boosting WL voltage, while using a higher threshold voltage $V_{thF}$ in the forward direction to retain charge and hence permit less frequent refreshing. The charge pump circuitry also makes use of the asymmetry by pumping with a lower reverse direction threshold voltage $V_{thR}$ and the charge pump circuitry provides charge retention with a higher forward direction threshold voltage $V_{thF}$.

When the difference of the threshold voltage $V_{th}$ between the forward direction $V_{thF}$ and reverse direction $V_{thR}$ is comparable to the absolute value of the threshold voltage $V_{th}$, the device asymmetry can be used to design circuits with better trade-offs between signal strength and leakage currents.

1. Introduction

The design trade-off of low-power and signal strength in dynamic and analog circuits usually determines the selection of threshold voltage $V_{th}$ in the CMOS technology. However, the threshold voltage $V_{th}$ of a device is not easily scalable with the continuous voltage and geometrical scaling in CMOS technology. This invention uses the geometrical source/drain asymmetry to improve the design trade-off between low-power consumption and signal strength. The previous work on source/drain asymmetry effects in CMOS devices has focused on the comparison with the symmetrical devices in the forward biasing directions. Parasitic RC elements and carrier transport in tailored channel electric fields have been quite comprehensively studied. None of the previous work has proposed to use both biasing directions to achieve better dynamic and analog circuit design. The asymmetrical CMOS pass transistors can pass signals reliably with a lower threshold voltage $V_{th}$, while retaining the signal on load capacitance with a higher threshold voltage $V_{th}$ and hence lower leakage. This feature is useful for many dynamic and analog circuits.

As an illustration, we an analysis of the cell design of DRAM and charge-pump circuits are provided below. Considering a 1.2V CMOS DRAM technology with 0.5V nominal threshold voltage, the word line (WL) needs to be boosted with charge pumping circuitry to above 2V for storing a strong binary 1. This not only consumes more power in larger voltage swing of the word line capacitance and charge-pump circuitry, but it also creates dielectric reliability problems as the result of the boosted voltages which are required.

Device Structure

An asymmetric S/D MOSFET can be created in many ways: one additional halo implant mask in bulk and partially depleted SOI (Silicon on Insulator) devices or other slight changes in fully-depleted SOI and nano-crystal EEPROM process flow. A possible asymmetric process uses Large-Angle Tilted (LAT) Halo implants at the source with additional masks.

The difference between the forward threshold voltage $V_{thF}$ and backward threshold voltage $V_{thR}$ is created by the different DIBL (Drain Induced Barrier Lowering) effects on source/drain reversal. DIBL is more effective when the source end potential has a smaller curvature (net charge density or looser potential boundary conditions). For example, in the Halo implant case, when electrons flow in the conventional direction from the source to the drain, the electrons face a larger source potential because of the heavier ion implantation at the source side, which we denote as the forward threshold voltage $V_{thF}$. When the source and drain voltages are reversed, the electrons will see a smaller barrier at the emission point, where we denote the reverse threshold voltage as $V_{thR}$.

Through proper design, $|V_{thF}-V_{thR}|$ can be around $V_{DD}/3$ to $V_{DD}/2$ for a given submicron technology.

For a sub-threshold slope of 80 mV–100 mV, the current ratio between reasonable $|V_{thF}-V_{thR}|$ can be as large as 500–5000 times (depending on the noise margin given for above-threshold).

Charge Pump Circuit

Referring to the dilemma posed as stated above with reference to Eq.(4), the fact that a lower $V_{th}$ will cause more leakage currents, but a higher $V_{th}$ will pose a lower bound for the values of C and f in the circuit of FIG. 3, our invention provides a solution by substituting MOSFET devices in the form of a series of asymmetric S/D structures which can break the design dilemma. A large forward threshold voltage $|V_{thF}|$ will block the leakage current that drains the storage capacitor, while small reverse threshold voltage $|V_{thR}|$ will give a lower voltage loss at each stage.

Figure 4:
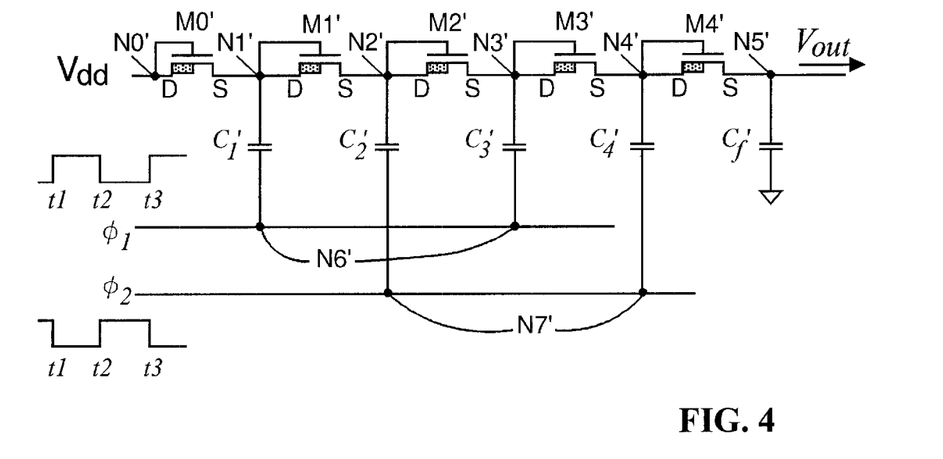
FIG. 4 shows a charge pump circuit in accordance with this invention utilizing a series of MOSFET devices which have asymmetric S/D structures.

FIG. 4 shows a Dickson type charge pump, in accordance with this invention, utilizing a series of MOSFET pass transistor devices M0'–M4' which have asymmetric S/D structures. The asymmetric SID MOSFET devices M0'–M4' can also be used to improve the performance of other types of charge pump circuits, such as a Fibonacci charge pump circuit. The charge pump circuit uses a series of asymmetric MOSFET devices M0' to M4' which are connected in a charge pump (bucket brigade) chain which generates a voltage higher than a source voltage Vdd. The devices M0' to M4' can comprise conventional halo implanted asymmetric devices as shown in FIG. 1 without the counterdoped region 11 or a simple Super Halo device with the counterdoped region 11 and preferably with the abrupt Super Halo contour.

It is also preferred that some or all of the various features of a Super Halo device of the kind described above and shown in FIGS. 1, 6E and 8E are included in the devices M0' to M4'. The charge pump circuit of FIG. 4 consists of asymmetric N-MOSFETs (Metal Oxide Semiconductor Field Effect Transistors) M0' to M4' connected in series. Each of the MOSFET transistors M0' to M4', which includes a drain D and a source S, is connected as a diode by having its gate and its drain D connected, i.e. short-circuited together at nodes N0'–N4'. Each of a set of charge pump capacitors $C_1'$–$C_4'$ has one terminal connected to the respective junction N1'–N4' of the gates and drains D of the MOSFETs M1'–M4', as well as the sources S of MOSFETs M0'–M3'. A fifth capacitor $C_f'$ is connected to the source S electrode of the FET M4'.

FIG. 4 also shows the input waveforms of two clocks $\phi_1$ and $\phi_2$ which control operation of the charge pump circuit of FIG. 4. The two clocks $\phi_1$ and $\phi_2$ are operated 180° out of phase with respect to each other and are alternately applied to the other ends of the capacitors $C_1'$–$C_4'$ with the capacitors $C_1'$ and $C_3'$ connected through node N6' to clock line $\phi_1$ and the capacitors $C_2'$ and $C_4'$ connected through node N7' to clock line $\phi_2$, as will be well understood by those skilled in the art of charge pumps.

The drain D and the gate of the MOSFET M1' are connected to the power supply voltage Vdd via an N-MOSFET M0'. The source S of the MOSFET M4' serves to provide the output voltage $V_{out}$ of the circuit. When the voltage on the node N1' increases, the first MOSFET M0' can prevent a charge from migrating from the junction N1' to the source voltage Vdd.

This invention allows more efficient writing in each DRAM capacitor with or without boosting the word line voltage, while use the higher threshold voltage in the forward direction serves to retain charge and hence for the DRAM to require refreshing less frequently.

Charge pump circuitry can also make use of the asymmetry by pumping with a lower threshold voltage $V_{thR}$ in the reverse direction but charge retention with a higher threshold voltage $V_{thF}$ in the forward direction.

Figure 5A:
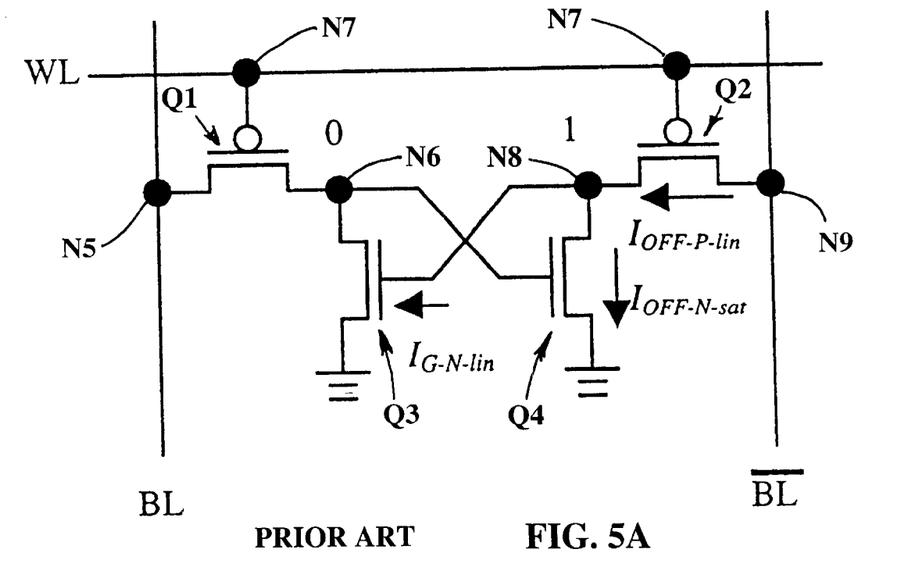
FIG. 5A shows a schematic diagram of a conventional prior art SRAM MOSFET circuit with cross coupled pass transistors, pull down transistors, a transverse word line, and bit lines.

FIG. 5A shows a schematic diagram of a conventional prior art SRAM circuit with cross coupled PMOS (p-channel) pass transistors Q1 and Q2, NMOS (n-channel) pull down transistors Q3 and Q4, transverse word line WL, and bit lines BL and BL-bar. The source of pass transistor Q1 is connected to bit line BL at node N5. The source of pass transistor Q2 is connected to bit line BL-bar at node N9. The gate electrodes of pass transistors Q1 and Q2 are connected to wordline WL at node N7. The drain electrode of pass transistor Q1 and the drain electrode of pull down transistor Q3 are connected through node N6 to the gate electrode of pull down transistor Q4. The drain electrode of pass transistor Q2 and the drain electrode of pull down transistor Q4 are connected through node N8 to the gate electrode of pull down transistor Q3. The source electrodes of pull down transistors Q3 and Q4 are connected to reference potential (ground). At standby retention, the wordline WL, bit line BL and bit line BL-bar are all at VDD. In variations of this device there are load transistors or load resistors connected between VDD and nodes N6 and N8 of the SRAM circuit.

The drain D and the gate of the MOSFET M1' are connected to the power supply voltage Vdd via an N-MOSFET M0'. The source S of the MOSFET M4' serves to provide the output voltage $V_{out}$ of the circuit. When the voltage on the node N1' increases, the first MOSFET M0' can prevent a charge from migrating from the junction N1' to the source voltage Vdd.

This invention allows more efficient writing in each DRAM capacitor with or without boosting the word line voltage, while use the higher threshold voltage in the forward direction serves to retain charge and hence for the DRAM to require refreshing less frequently.

Charge pump circuitry can also make use of the asymmetry by pumping with a lower threshold voltage $V_{thR}$ in the reverse direction but charge retention with a higher threshold voltage $V_{thF}$ in the forward direction.

Figure 5B:
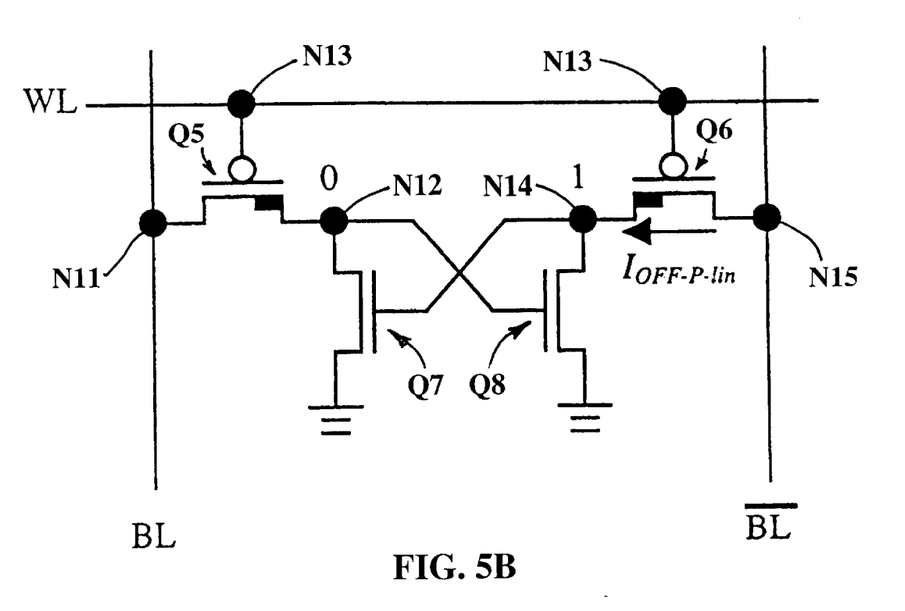
FIG. 5B shows a schematic diagram of an SRAM MOSFET circuit in accordance with this invention with cross coupled Super Halo asymmetric PMOS pass transistors, NMOS pull down transistors, a transverse word line, and bit lines.

FIG. 5B shows a schematic diagram of an SRAM circuit in accordance with this invention with cross coupled Super Halo asymmetric PMOS (p-channel) pass transistors Q5 and Q6, conventional NMOS (n-channel) pull down transistors Q3 and Q4, transverse word line WL, and bit lines BL and BL-bar. The source of Super Halo asymmetric pass transistor Q5 is connected to bit line BL at node N11. The source of Super Halo asymmetric pass transistor Q5 is connected to bit line BL-bar at node N9. The gate electrodes of Super Halo asymmetric pass transistors Q5 and Q6 are connected to wordline WL at node N13. The drain electrode of Super Halo asymmetric pass transistor Q5 and the drain electrode of pull down transistor Q7 are connected through node N12 to the gate electrode of pull down transistor Q8. The drain electrode of Super Halo asymmetric pass transistor Q6 and the drain electrode of pull down transistor Q8 are connected through node N14 to the gate electrode of pull down transistor Q7. The source electrodes of pull down transistors Q7 and Q8 are connected to reference potential (ground). At standby retention, the wordline WL, bit line BL and bit line BL-bar are all at $V_{DD}$. In variations of this device there are load transistors or load resistors connected between $V_{DD}$ and nodes N12 and N14 of the SRAM circuit.

Figure 5C:
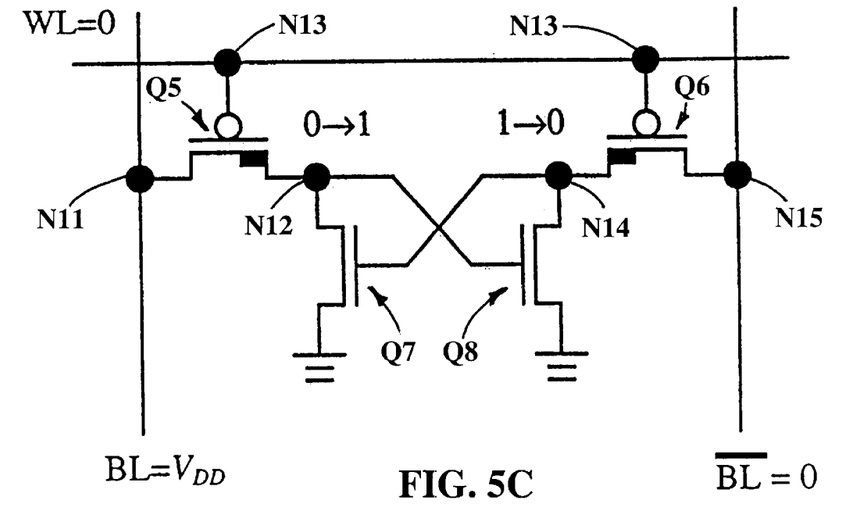
FIG. 5C is the circuit of FIG. 5B with the word line WL at 0Volts, the bit line BL at $V_{DD}$ and the bit line-bar at 0Volts to write (flipping the storage node).

FIG. 5C is the circuit of FIG. 5B with the word line WL at 0Volts, the bit line BL at $V_{DD}$ and the bit line-bar at 0 Volts to write (flipping the storage node) as node N12 goes from "0" to "1" and node N14 goes from "1" to "0".

Figure 5D:
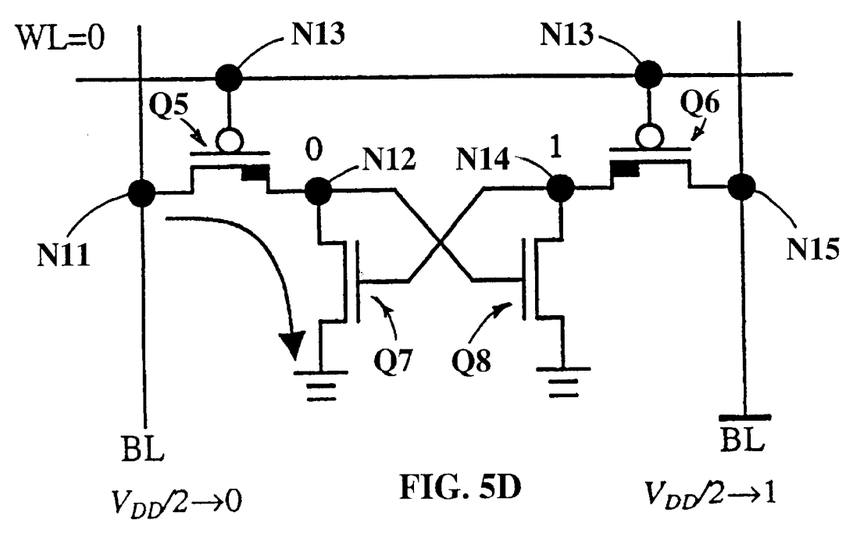
FIG. 5D is the circuit of FIG. 5B with the word line WL at 0Volts, the bit line BL at $V_{DD}/2 \rightarrow 0$ and the bit line-bar at $V_{DD}/2 \rightarrow 1$Volt to read.

FIG. 5D is the circuit of FIG. 5B with the word line WL at 0Volts, the bit line BL at $V_{DD}/2\rightarrow 0$ and the bit line-bar at $V_{DD}/2\rightarrow 1$Volt to read (perturbing the equalized bit lines) as node N12 is at "0" and node N14 is at "1".

Main Features of Processing Super Halo MOS FET Devices

A) Use a shallow counter-doped threshold voltage (Vt) implant to create an abrupt vertical profile in a monocrystalline silicon substrate, B) Employ one, two or three positions of 15 degree, tilt halo LAT implants to create Source/Drain asymmetry.

C) After the step of LAT ion implanting the halo, employ only one final (Rapid Thermal Anneal) RTA at the end to activate the dopants of the gate electrode, the extension regions, the Halo region, and the Source and Drain regions for both NFET and PFET device.

Process Flow
1) Regular Shallow-Trench-Isolation (STI) Process for Isolation
2) N-Well implants of 2E13–8E13 atoms/cm² of phosphorous at 40–80 KeV.
   2A) Shallow-Counter-doped implant (create vertical abrupt doping profile)
   Blanket implant: Preferred dose: 4E11–8E11 ions/cm² of $BF_2$ Preferred energy: 20–30 KeV
3) P-Well implants of 1E14–4E14 ions/cm2 of $BF_2$ at 300–400 KeV
   3A) Shallow-Counter-doped implant (Create vertical abrupt doping profile),
   Implant Arsenic Preferred dose: 1E12–4E12 atoms/cm² of Preferred energy: 5 KeV–15 KeV
4) First RTA for the wells in the range of about 900° C.–1000° C. for about 5 seconds
5) Gate oxide 10 Angstroms–20 Angstroms
6) Gate doped polysilicon deposition 1000 Angstroms–1500 Angstroms
7) Gate Electrode Stack Formation
   7A) Lithography: Form mask to pattern gate electrode stacks
   7B) Etch through mask to form gate electrode/gate oxide stacks
   7C) Reoxidize the ends of the polysilicon gate electrodes to form polyoxide spacers adjacent to the polysilicon gate electrode
8) NFET Arsenic Extension implant Dose: 1E15–2E15 atoms/cm² Energy: 5 KeV–10 KeV
9) 15 deg. Tilt (1, 2 or 3 positions) Asymmetric boron halo implants Dose: 3E13–5E13 ions/cm² $BF_2$ Energy: 10 KeV–15 KeV
10) PFET $BF_2$ Extension implant Dose: 1.0–2E15 atoms/cm²; Energy: 5–10 KeV
11) 15 deg. Tilt (1, 2 or 3 rotary positions) As halo Implants (asymmetric halo) Dose: 4E13–8E13 atoms/cm² Energy: 80 KeV–150 KeV,
12) Form Silicon Nitride spacer for Source/Drain next to polyoxide spacers adjacent to polysilicon gate electrode
13) NFET Source/Drain implant of phosphorous dopant Dose: 2–8E15 atoms/cm² Energy: 10–15 KeV
14) PFET Source/Drain Implant: Boron Dose: 2–8E15 atoms/cm² Energy: 7–10 KeV
15) Second and the final RTA for activating the doping at about 1000° C. for about 5–10 seconds thereby maintaining abrupt halo profile
16) Cobalt silicide process
17) Back End Of Line (BEOL) process FIGS. 6A–6E show schematic sectional views of process steps for forming an PMOS FET in device 30 as shown in FIG. 6E with an N+ doped Super Halo implanted region 45 near the P+ doped source 51 and a slight N+ doped halo region 46 near the P+ drain extension 44 in accordance with this invention.

Figure 8A:
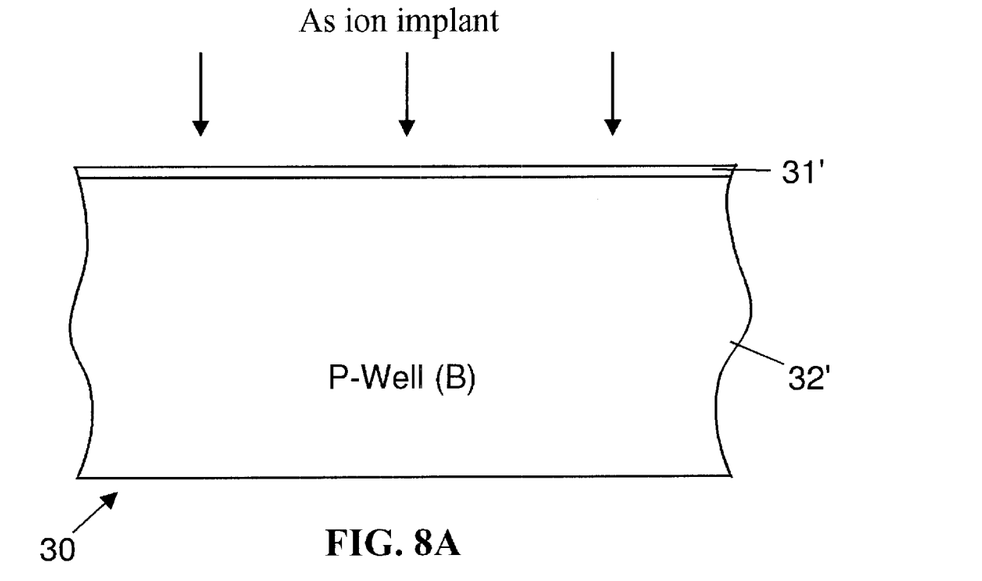
FIGS. 8A–8E show schematic sectional views of process steps for forming a NMOS FET in device as shown in FIG. 8E with an P+ doped Super Halo implanted region near the N+ doped source and a slight P+ doped halo region near the N+ drain extension in accordance with this invention.
Figure 8B:
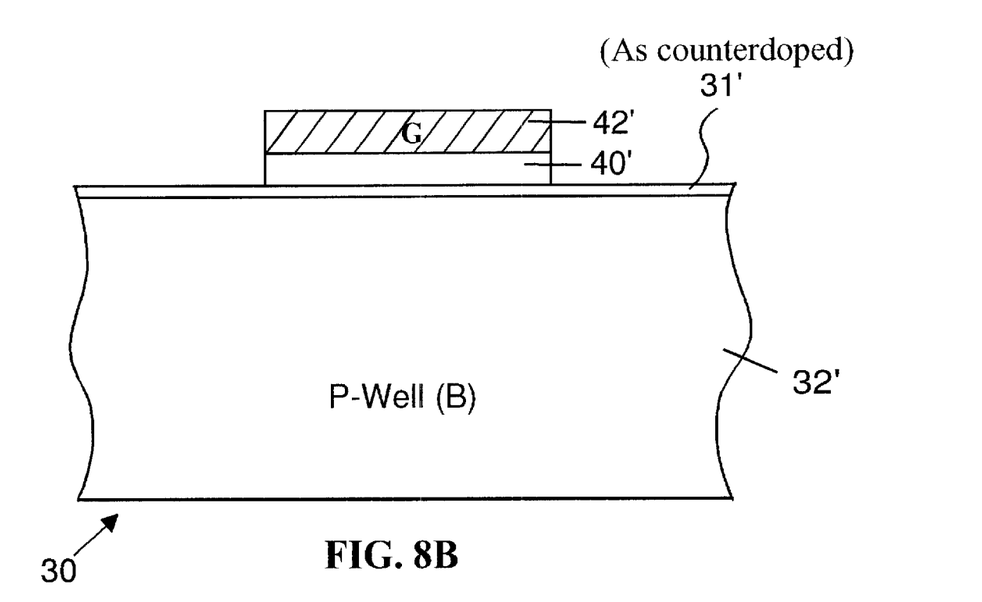
Figure 8C:
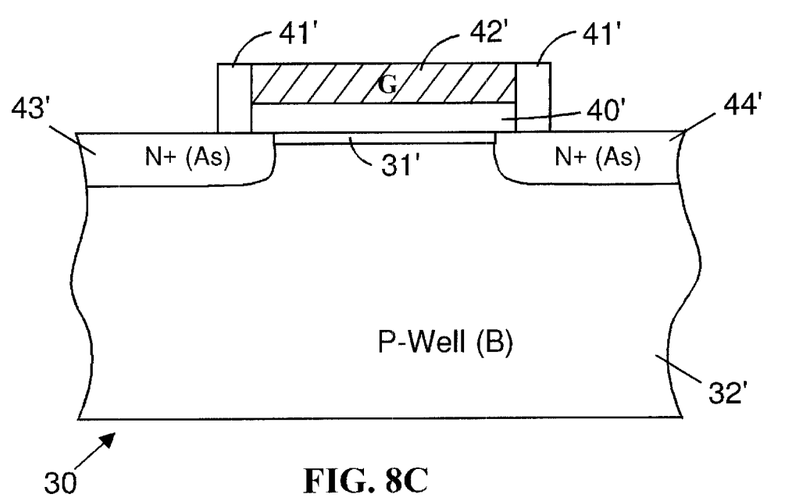
Figure 8D:
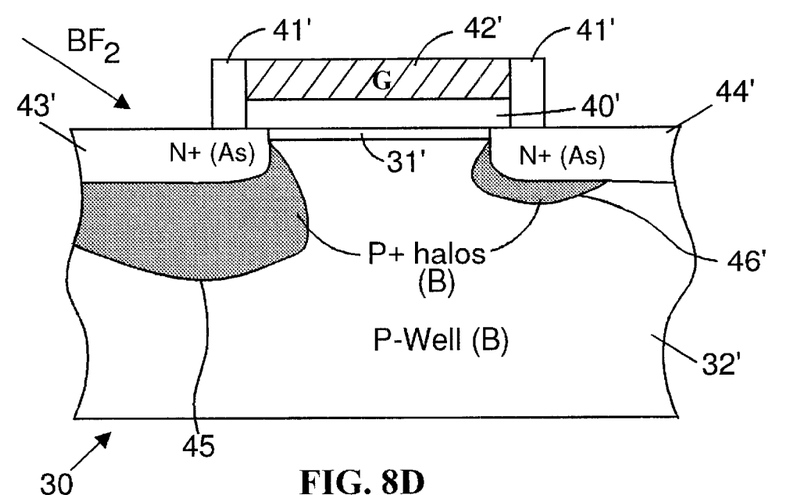
Figure 8E:
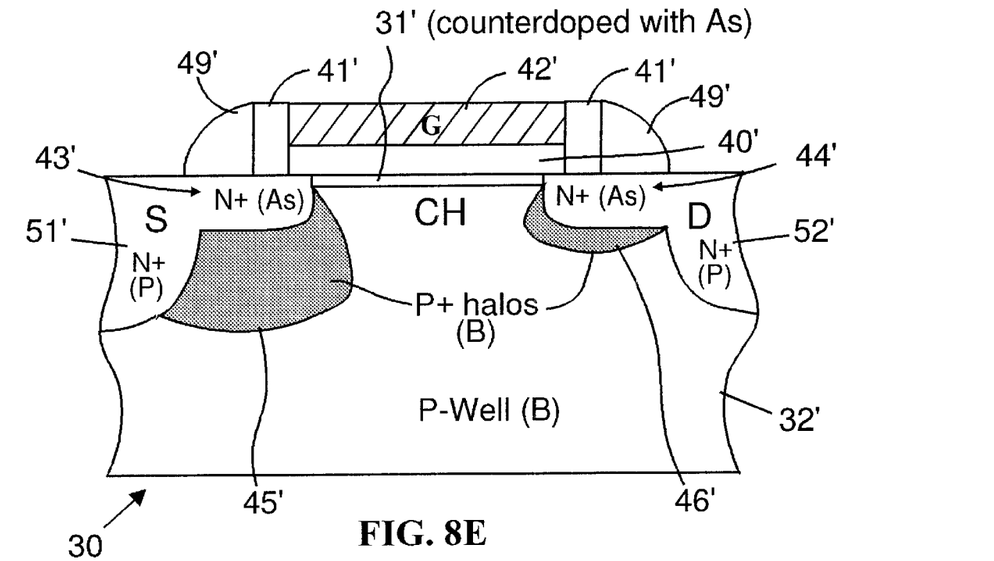
Figure 9:
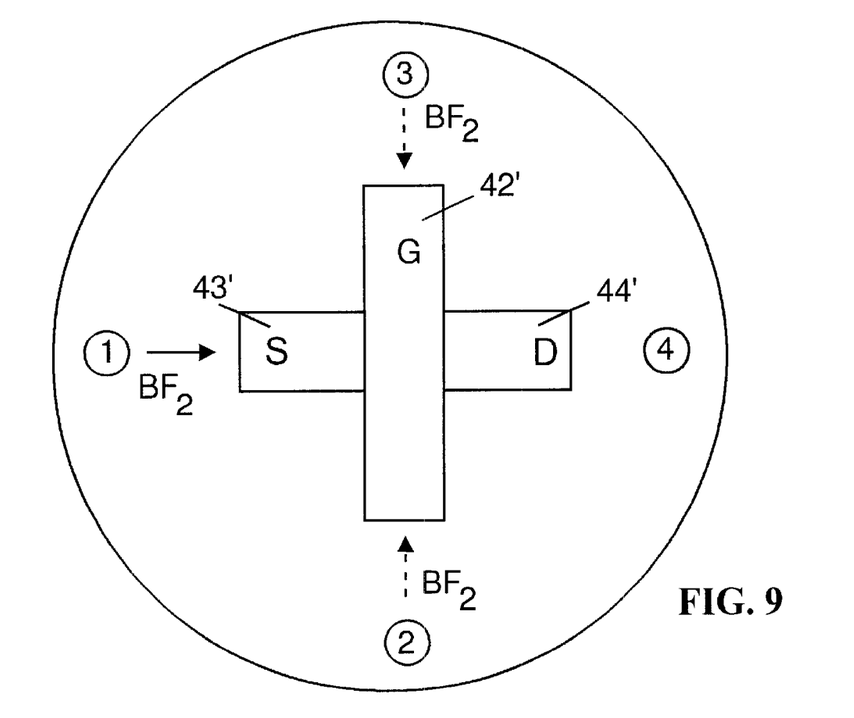
FIG. 9 is a plan view looking down on top of FIGS. 8D and 8E showing one or three angles of LAT implanting of the halo for the NMOS device with the gate electrode centered and the source and drain regions on the left and right.

FIGS. 8A–8E show schematic sectional views of process steps for forming a NMOS FET in device 30 as shown in FIG. 8E with an P+ doped Super Halo implanted region 45' near the N+ doped source 51' and a slight P+ doped halo region 46' near the N+ drain extension 44' in accordance with this invention.

Figure 6A:
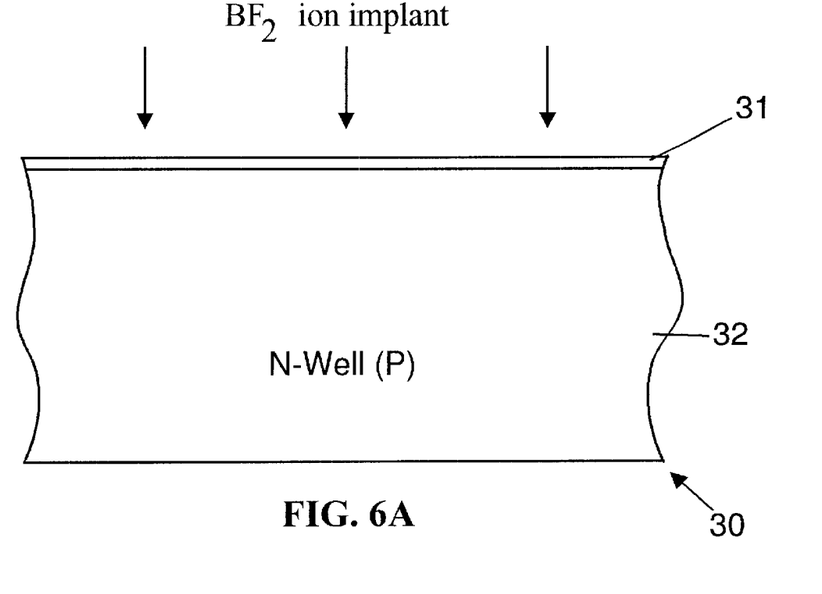
FIGS. 6A–6E show schematic sectional views of process steps for forming an PMOS FET device shown in FIG. 6E with a Super Halo region near its source and a slight halo region near its drain extension in accordance with this invention.

Referring to FIG. 6A, the drawing shows the NMOS portion of a device 30 in an early stage of the process flow (Above) after completion of steps 1 and 2 thereof in which the STI trenches (not shown for convenience of illustration) have been formed in device 30 in step 1.

FIG. 6A also shows the result of formation in step 2 (above) of a phosphorus doped N-well 32 as a portion of a monocrystalline silicon semiconductor substrate of device 30 with a low dose of 2E13–8E13 atoms/cm$^2$ of phosphorous implanted with a low energy of 40–80 KeV.

Form Shallow Counterdoped Boron Implant in Surface of N-well

FIG. 6A also shows the performance of step 2A (above) in which the top surface of the N-well 32 is being ion implanted with a very low dose of 4E11–8E11 atoms/cm$^2$ boron ions at a very low preferred energy of 20–30 KeV (as compared to the dose and energy in step 2) to form a shallow P– doped region 31 in the surface of the N-well 32. This is done to create an abrupt halo doping profile in the vertical dimension and to provide short-channel-effect control, and to provide a process which is more scalable compared to the prior art.

FIG. 8A shows the result of formation in step 3 (above) of a P-well 32' doped with a low dose of 1E14–4E14 atoms/cm$^2$ of boron implanted at a low energy of 300–400 KeV in the monocrystalline silicon semiconductor substrate.

Form Shallow Counterdoped Arsenic Implant in Surface of P-well

FIG. 8A also shows the performance of step 3A (above) in which the top surface of the P-well 32' is being ion implanted with arsenic ions with a very low dose of 1E12–4E12 atoms/cm$^2$ of arsenic ions at a very low preferred energy of 5–15 KeV (as compared to the dose and energy in step 3 to form a shallow N– doped region 31' in the surface of the N-well 32'. Once again, we repeat that this is done to create an abrupt halo doping profile in the vertical dimension and to provide short-channel-effect control, and to provide a process which is more scalable compared to the prior art.

Perform Initial Rapid Thermal Annealing of N– and P– Wells

Then after the step 3A (above), in step 4 (above) Rapid Thermal Annealing (RTA) is performed, as described above.

Form Blanket Gate Oxide and Polysilicon Layers

Figure 6B:
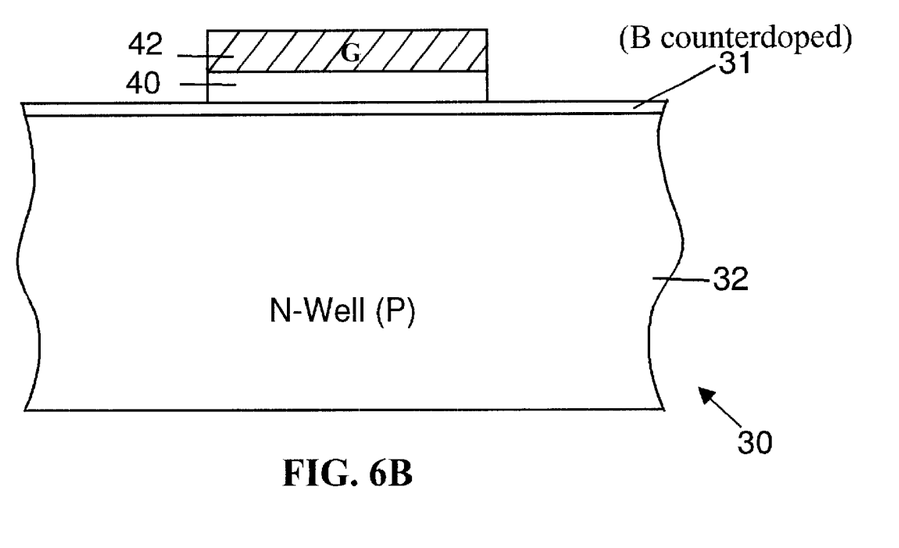

FIGS. 6B and 8B show the devices of FIGS. 6A and 8A after step 5 (above) during which a blanket silicon oxide layer 40 about 10 to 20 Angstroms thick (e.g. a silicon dioxide gate oxide layer) was formed on the surface of both wells 32 and 32' of the device 30 as shown in FIGS. 6B and 8B followed by step 6 that was performed in which gate electrode polysilicon layer 42/42' was formed on the surface of the blanket gate oxide layer 40/40' of both wells 32 and 32' of the device 30, as shown in FIGS. 6B and 8B, comprising a blanket polysilicon layer about 1,000 to 2,000 Angstroms thick covering the counterdoped regions 31/31' in FIGS. 6B and 8B.

Form Gate Electrode Stack Photolithographic Mask

Then in step 7A using a photolithographic process a photoresist, photolithographic mask is formed for patterning gate electrode stacks by covering portions of the gate polysilicon layer 42/42' which are to be retained as gate electrodes and leaving the unwanted portions of the gate polysilicon layer 42/42' exposed.

Form Gate Electrode/Gate Oxide Stacks

Step 7B employs etching through mask to form gate electrode/gate oxide stacks. The step of etching can be substituted for another form of subtractive process in which the exposed portions of the gate polysilicon layer 42/42' and silicon oxide (gate oxide) layer 31 are removed, leaving the gate electrode stacks 42/40 and 42'/40' as shown in FIGS. 6B and 8B over the N-well 32 and P-well 32' respectively leaving portions of the counterdoped regions 31/31' thereof exposed, aside from the gate electrode stacks 42/40 and 42'/40'.

Formation of Polyoxide Spacers

Figure 6C:
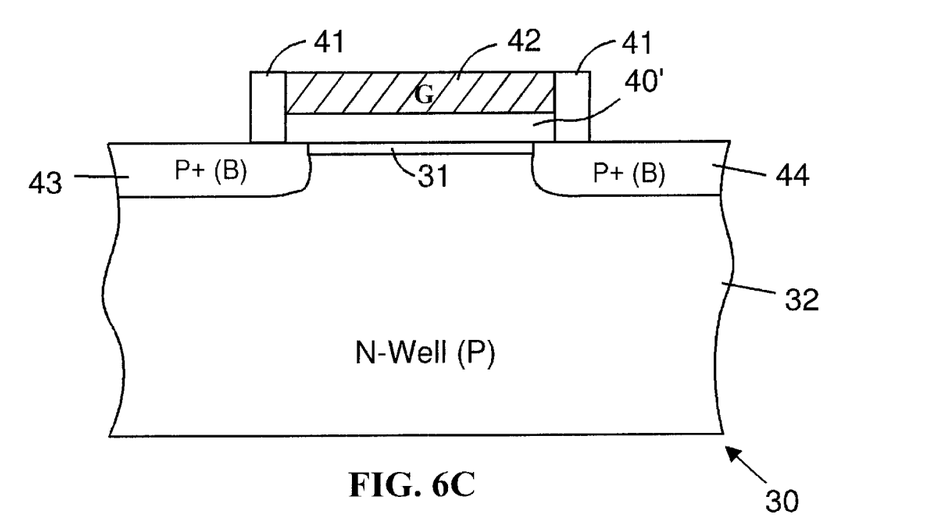

Then in step 7C the process reoxidizes the ends of the polysilicon gate electrodes to form polyoxide spacers 41/41' in FIGS. 6C/8C adjacent to the polysilicon gate electrode stacks 42/40 and 42'/40' covering the sidewalls of the gate electrode stacks.

NFET Arsenic Extension Implant in P-Well

In step 8, referring to FIG. 8C, a set of arsenic doped extensions 43'/44' are formed in the P-well 32' to the left and the right of the gate electrode 42' and self-aligned with the polyoxide spacers 41' adjacent to the gate electrode 42' with a high dose of about 1E15–2E15 atoms/cm$^2$ at an energy of about 5–10 KeV.

Asymmetric Boron Halo Implant(s) in P-Well

In step 9, referring to FIG. 8D a LAT implant of the halo for the NMOS device is formed with a tilt preferably at a tilt angle of about fifteen degrees (15°) at one or several positions about the circumference of the device as indicated in FIG. 9 where it is indicated that the implanting is performed at one position or at three positions. FIG. 9 is a plan view looking down on top of FIGS. 8D and 8E showing one and three angles of LAT implant of the halo for the NMOS device with the gate electrode 42' in the center, the source region 43' on the left and the drain region 44' on the right. The circled "1" refers to the direction for a LAT halo implant aligned along the center of source region 43' from the source region side of the gate electrode 42' directed at right angles to the gate electrode at an angle of about 15 degrees as indicated by FIG. 8D of boron difluoride (BF$_2$) with a dose of about 3E13–5E13 ions/cm$^2$ at an energy of about 10–15 KeV.

The circled "2" and the circled "3" in FIG. 9 refer to halo ion implantation at right angles to the implantation from circle "1" along the length of the gate electrode which produces a P+ right side halo 46' with a much lower concentration of dopant beneath the N+ drain extension 44' which improves the short-channel-effect. Note that no ion implantation is provided from the direction indicated by the circled "4" which assures the asymmetric pattern of halo implantation.

PFET BF$_2$ Extension Implant in N-Well

In step 10, referring to FIG. 6C, a set of boron doped P+ extensions 43/44 are formed in the N-well 32 to the left and the right of the gate electrode 42 and self-aligned with the polyoxide spacers 41 adjacent to the gate electrode 42 with a high dose of about 1E15–2E15 atoms/cm$^2$ of boron difluoride (BF$_2$) at an energy of about 5–10 KeV.

Asymmetric Arsenic Halo Implant(s) in N-Well

Figure 6D:
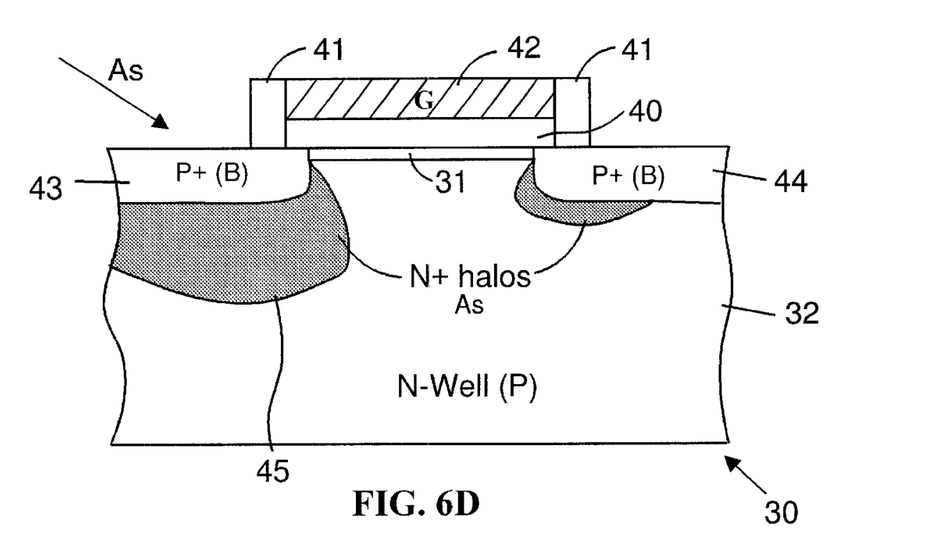
Figure 6E:
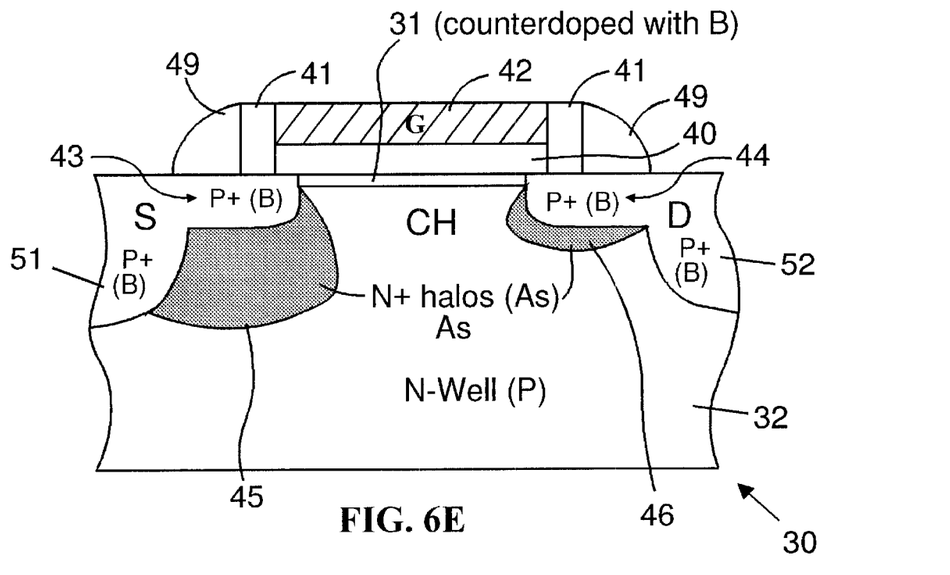
Figure 7:
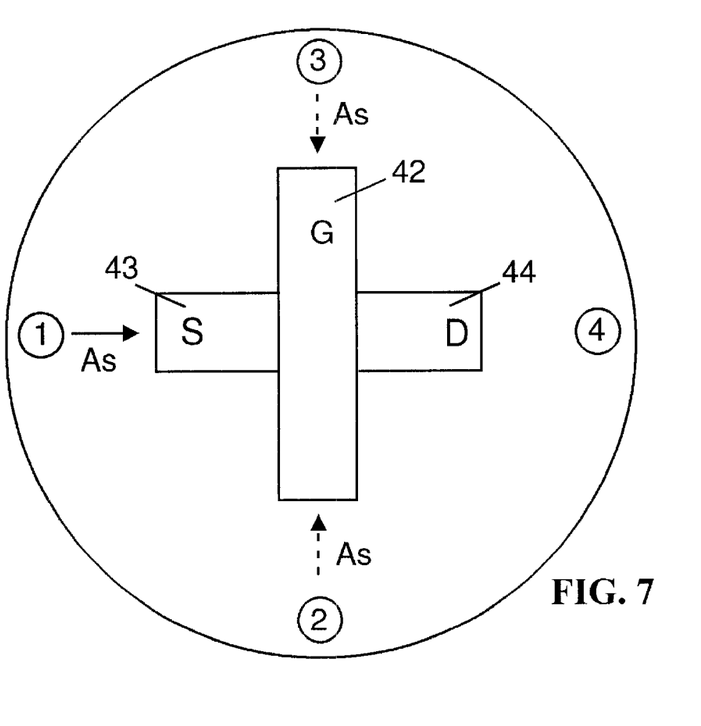
FIG. 7 is a plan view looking down on top of FIGS. 6D and 6E illustrating one or three angles of LAT implanting of the halo for the PMOS with the gate electrode centered and the source and drain regions on the left and right.

In step 11, referring to FIG. 6D a LAT implant of the halo for the PMOS device is formed with a tilt preferably at a tilt angle of about fifteen degrees (15°) at one or several positions about the circumference of the device as indicated in FIG. 7 where it is indicated that the implanting is performed at one position or at three positions. FIG. 7 is a plan view looking down on top of FIGS. 6D and 6E illustrating one angle or three angle of the LAT implant of the halo for the PMOS with the gate electrode 42 in the center, the source region 43 on the left and the drain region 44 on the right. The circled "1" refers to the direction for a LAT halo implant aligned along the center of source region 43 from the source region side of the gate electrode 42 directed at right angles to the gate electrode at an angle of about 15 degrees as indicated by FIG. 8D of boron difluoride (BF$_2$) with a dose of arsenic atoms of about 4E13–8E13 atoms/cm$^2$ at an energy of about 80–150 KeV.

The circled "2" and the circled "3" in FIG. 7 refer to halo ion implantation at right angles to the implantation from circle "1" along the length of the gate electrode which produces an N+ right side halo 46 with a much lower concentration of dopant beneath the P+ drain extension 44 which improves the short-channel-effect. Note that no ion implantation is provided from the direction indicated by circled "4" which assures the asymmetric pattern of halo implantation.

In step 12, referring to FIGS. 6E and 8E silicon nitride spacers 49/49' are formed adjacent to the polyoxide spacers 41/41' respectively, adjacent to the polysilicon gate electrodes.

In step 13, referring to FIG. 8E a source/drain implant N+ of phosphorous dopant is performed with a dose of about 2–8E15 atoms/cm$^2$ at an energy of about 10–15 KeV to form N+ Source/Drain regions 51'/52' self-aligned with the spacers 49' on either side of the gate electrode 42' of the NFET device.

In step 14, referring to FIG. 6E a source/drain implant P+ of boron difluoride (BF$_2$)dopant is performed with a dose of about 2–8E15 ions/cm$^2$ at an energy of about 7–10 KeV to form P+ Source/Drain regions 51/52 self-aligned with the spacers 49 on either side of the gate electrode 42 of the PFET device.

In step 15 the second, final RTA is performed to activate the doping at about 1000° C. for about 5–10 seconds thereby maintaining abrupt halo profiles for the NFET and PFET devices of FIGS. 6E and 8E.

In step 16 a conventional cobalt silicide process is performed to form a silicide layer (not shown) on the surface of the gate electrodes 42/42'.

In step 17 a conventional Back End Of Line (BEOL) process step is performed as will be well understood by those skilled in the art.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A charge pump with a plurality of stages with each stage including a capacitor, and each stage including an asymmetric MOSFET device connected to an alternate one of the clocks through the capacitor associated with the stage.

2. The charge pump of claim 1 comprising:

first and second clocks having a phase differential;

a plurality of stages of each comprising an asymmetric FET transistor with substantially different forward and reverse threshold voltages and a capacitor, each stage comprising as follows:

the asymmetric FET transistor of each stage including a semiconductor substrate with a channel, a drain region and a source region, the drain region being connected to a drain electrode, the source region being connected to a source electrode, a gate electrode stack comprising a silicon oxide layer and a gate electrode formed above the channel, with the drain electrode being electrically connected through an input node to the gate electrode of the FET transistor and the source electrode of each stage being connected to an output node, the capacitor of each stage having a first capacitor plate and a second capacitor plate with the first capacitor plate being connected to the source electrode of that stage, the stages being connected in series with the source electrode and the first capacitor plate of a preceding stage being connected to the input node of a succeeding stage, and the second plates of the capacitors being coupled alternately along the sequence of stages to the first clock and the second clock.

3. The charge pump of claim 2 wherein the asymmetric FET transistor has a source region halo implant.

4. The charge pump of claim 2 wherein the asymmetric FET transistor has a source region super halo implant.

5. The charge pump of claim 2 wherein the asymmetric FET transistor has a source region super halo implant with a shallow counterdoped portion of the channel.

6. The charge pump of claim 2 wherein the asymmetric FET transistor has a source region super halo implant with a shallow counterdoped portion of the channel and source and drain extensions adjacent to the channel between the source region and the drain region.

7. The charge pump of claim 2 wherein the asymmetric FET transistor has a source region super halo implant with a shallow counterdoped portion of the channel and source and drain extensions adjacent to the channel between the source region and the drain region with an abrupt halo contour.

8. The charge pump of claim 1 wherein the asymmetric FET transistor has a source region halo implant, and the stages are driven by at least two clocks in which for each positive integer "i" from 1 to n−1, the ith stage is caused to have a structure in which it has large current drivability.

9. The charge pump of claim 1 wherein the asymmetric FET transistor has a source region super halo implant, and the stages are driven by at least two clocks in which for each positive integer "i" from 1 to n−1, the ith stage is caused to have a structure in which it has large current drivability.

10. The charge pump of claim 1 wherein the asymmetric FET transistor has a source region super halo implant with a shallow counterdoped portion of the channel, and the stages are driven by at least two clocks in which for each positive integer "i" from 1 to n−1, the ith stage is caused to have a structure in which it has large current drivability.

11. The charge pump of claim 1 wherein the asymmetric FET transistor has a source region super halo implant with a shallow counterdoped portion of the channel and source and drain extensions adjacent to the channel between the source region and the drain region, and the stages are driven by at least two clocks in which for each positive integer "i" from 1 to n−1, the ith stage is caused to have a structure in which it has large current drivability.

12. The charge pump of claim 11 wherein the asymmetric FET transistor has a source region super halo implant with a shallow counterdoped portion of the channel and source and drain extensions adjacent to the channel between the source region and the drain region with an abrupt halo contour.

13. The charge pump of claim 1 comprising:

a plurality (n) of charge pump stages (1,2,3,4 . . . n) from a first (1th) to a last (nth) stage connected in series comprising odd numbered stages (1, 3, . . . ) and even numbered stages (2, 4, . . . ), a pair of clock pulse lines, including a first clock pulse line and a second clock pulse line, the first clock pulse line connected to the odd numbered stages (1, 3, . . . ) of the charge pump stages, the second clock pulse line connected to the even numbered stages (2, 4, . . . ) of the charge pump stages, each stage including an MOSFET transistor including a source, a drain and a gate electrode with the source connected to the drain and a charge pump capacitor connected to the source, and each of the MOSFET transistors comprising an asymmetric transistor with a forward threshold voltage ($V_{thF}$) and with a reverse threshold voltage ($V_{thR}$), with the forward threshold voltage $V_{thF}$ being substantially larger than the reverse threshold voltage $V_{thR}$.

14. The charge pump of claim 13 wherein the asymmetric FET transistor has a source region halo implant.

15. The charge pump of claim 13 wherein the asymmetric FET transistor has a source region super halo implant.

16. The charge pump of claim 13 wherein the asymmetric FET transistor has a source region super halo implant with a shallow counterdoped portion of the channel.

17. A charge pump of claim 13 wherein the asymmetric FET transistor has a source region super halo implant with a shallow counterdoped portion of the channel and source and drain extensions adjacent to the channel between the source region and the drain region.

18. The charge pump of claim 13, wherein the asymmetric FET transistor has a source region super halo implant with a shallow counterdoped portion of the channel and source and drain extensions adjacent to the channel between the source region and the drain region with an abrupt halo contour.

19. The charge pump of claim 1 being provided with pass transistors wherein each of said pass transistors is a super Halo asymmetric FET transistor.

20. The charge pump of claim 19 wherein the asymmetric FET transistor has a source region super halo implant with a shallow counterdoped portion of the channel.

21. The charge pump of claim 19 wherein the asymmetric FET transistor has a source region super halo implant with a shallow counterdoped portion of the channel and source and drain extensions adjacent to the channel between the source region and the drain region.

22. The charge pump of claim 19 wherein the asymmetric FET transistor has a source region super halo implant with a shallow counterdoped portion of the channel and source and drain extensions adjacent to the channel between the source region and the drain region with an abrupt halo contour resulting.

23. A method comprising:

forming a charge pump with a plurality of stages with each stage including a capacitor, and forming the charge pump with each stage including an asymmetric MOSFET device connected to an alternate one of the clocks through the capacitor associated with the stage.

24. The method of claim 23 including:

forming an asymmetric FET transistor of each stage including a semiconductor substrate with a channel, forming a gate electrode stack comprising a silicon oxide layer and a gate electrode formed above the channel, forming a drain region and a source region, the drain region being connected to a drain electrode, the source region being connected to a source electrode, connecting the drain electrode electrically connected through an input node to the gate electrode of the FET transistor and connecting the source electrode of each stage to an output node forming the asymmetric FET transistor with substantially different forward and reverse threshold voltages, forming a capacitor, with the capacitor of each stage having a first capacitor plate and a second capacitor plate with the first capacitor plate being connected to the source electrode of that stage, and the first and second clocks have a phase differential.

* * * * *